US012808960B2

(12) United States Patent
Harris et al.

(10) Patent No.: US 12,808,960 B2
(45) Date of Patent: Nov. 24, 2026

(54) SYSTEM AND METHOD OF AN OPTIMAL PERSISTENT SWITCH DESIGN FOR FAST RAMPING OF A SUPERCONDUCTING MAGNET

(71) Applicant: SYNAPTIVE MEDICAL INC., Toronto (CA)

(72) Inventors: Chad Tyler Harris, Toronto (CA); Geron André Bindseil, London (CA); William Handler, Toronto (CA)

(73) Assignee: Bala Sundararajan, Borough Of Malvern, PA (US)

( * ) Notice: Subject to any disclaimer, the term of this patent is extended or adjusted under 35 U.S.C. 154(b) by 155 days.

(21) Appl. No.: 18/883,778

(22) Filed: Sep. 12, 2024

(65) Prior Publication Data

US 2026/0092994 A1 Apr. 2, 2026

Related U.S. Application Data

(60) Provisional application No. 63/607,133, filed on Dec. 7, 2023.

(51) Int. Cl.
*G01R 33/34* (2006.01)
*H01B 12/16* (2006.01)
(Continued)

(52) U.S. Cl.
CPC ......... *G01R 33/3403* (2013.01); *H01B 12/16* (2013.01); *H01F 6/04* (2013.01); *H01F 6/06* (2013.01)

(58) Field of Classification Search
None
See application file for complete search history.

(56) References Cited

U.S. PATENT DOCUMENTS 5,661,401 A 8/1997 Ishikawa et al.
6,067,001 A 5/2000 Xu et al.
(Continued)

FOREIGN PATENT DOCUMENTS

CN 101297211 A 10/2008
CN 104730475 B 7/2020
(Continued)

OTHER PUBLICATIONS

Harris et al.: "A New Approach to Shimming: The Dynamically Controlled Adaptive Current Network", Magnetic Resonance in Medicine, vol. 71, No. 2, pp. 859-869, published on Mar. 15, 2013 (Mar. 15, 2013).

*Primary Examiner* — Rodney E Fuller

(57) ABSTRACT

A persistent current switch and method for fast ramping of an MRI system is provided. The persistent current switch wire is distributed in at least one layer over a bobbin. Each of the layers of the persistent current switch wire is in contact with at least one thermally conductive cooling surface. The cooling surface cools the persistent current switch wire to the threshold temperature for a superconducting state. The method includes distributing the persistent current switch wire in at least one layer over a bobbin. Each of the layers of the persistent current switch wire is in contact with at least one thermally conductive cooling surface and the cooling surface cools the persistent current switch wire to a superconducting state.

20 Claims, 3 Drawing Sheets

(51) Int. Cl.
*H01F 6/04* (2006.01)
*H01F 6/06* (2006.01)

(56) References Cited

U.S. PATENT DOCUMENTS

| | | | | |
|---|---|---|---|---|
| 6,157,280 | A | 12/2000 | Arz et al. | |
| 6,278,275 | B1 | 8/2001 | Petropoulos et al. | |
| 6,977,502 | B1 | 12/2005 | Hertz | |
| 7,598,740 | B2 | 10/2009 | Fischer et al. | |
| 8,319,495 | B1 | 11/2012 | Zhu | |
| 8,390,288 | B2 | 3/2013 | Graesslin et al. | |
| 8,720,072 | B2 | 5/2014 | Bucco | |
| 11,073,581 | B2 | 7/2021 | Connell | |
| 11,320,500 | B2 | 5/2022 | Authelet et al. | |
| 11,385,308 | B2 | 7/2022 | Popescu | |
| 2011/0257017 | A1* | 10/2011 | Park | H01F 6/06 505/211 |
| 2019/0108933 | A1 | 4/2019 | Urbahn et al. | |
| 2024/0045009 | A1* | 2/2024 | Kodama | G01R 33/3815 |

FOREIGN PATENT DOCUMENTS

| | | | | | |
|---|---|---|---|---|---|
| CN | 111707690 | B | | 10/2022 | |
| CN | 117100244 | A | | 11/2023 | |
| DE | 4422781 | C1 | | 2/1996 | |
| DE | 10025582 | C1 | | 12/2001 | |
| EP | 0740314 | A1 | * | 10/1996 | H01F 6/006 |
| EP | 2439754 | A1 | * | 4/2012 | H01F 6/04 |
| EP | 3703142 | A1 | * | 9/2020 | H01F 6/04 |
| JP | H0521852 | A | * | 1/1993 | |
| JP | H0661035 | A | * | 3/1994 | |
| JP | H06151985 | A | * | 5/1994 | |
| JP | 3083475 | B2 | | 9/2000 | |
| JP | 6062234 | B2 | | 1/2017 | |
| JP | 2019220524 | A | * | 12/2019 | |
| JP | 7458316 | B2 | | 3/2024 | |
| KR | 20020019322 | A | * | 3/2002 | H01F 6/00 |
| WO | 2004046745 | A1 | | 6/2004 | |

* cited by examiner

SYSTEM AND METHOD OF AN OPTIMAL PERSISTENT SWITCH DESIGN FOR FAST RAMPING OF A SUPERCONDUCTING MAGNET

CROSS-REFERENCE TO RELATED APPLICATIONS

This application claims priority from U.S. provisional application No. 63/607,133, filed Dec. 7, 2023, the contents of which are incorporated herein by reference.

TECHNICAL FIELD

The present disclosure is related to systems and methods for magnetic resonance imaging. More particularly, the disclosure relates to systems and methods for persistent current switch design for ramping of a superconducting magnet.

BACKGROUND

Magnetic Resonance Imaging (MRI) systems commonly contain a superconducting magnet that is kept energized at all times after installation, except perhaps during servicing or emergencies. For such magnets, the controlled process of ramping the magnet on or off can be quite slow so as to control heating and reduce helium boil off. Some MRI systems may be designed to allow the magnet to be ramped on or off more rapidly. For some MRI use cases, there is an advantage to ramp the superconducting magnet on and off as quickly as possible. This allows one to safely remove the field in cases of emergency, which improves the safety profile of the device and can reduce the risk of device damage, for instance during natural disasters. This also allows the user to more rapidly energize the magnet, which can shorten the time to start an MRI scanning session in cases where the magnet was previously in an off state for whatever reason. There are multiple sources of power deposition into the superconducting system during a field ramping cycle. One of these sources is the persistent current switch.

The persistent current switch is connected in series with the main magnet coils in a superconducting magnet. The external electrical leads of the superconducting magnet are connected across the switch. When the operator desires to add current to the magnet (i.e., to "ramp up" the magnetic field) the persistent current switch is heated above its superconducting transition temperature so that it becomes resistive.

A voltage is then applied by the magnet power supply which gradually increases the current through the magnet. This process is typically slow because the self-inductance of a superconducting magnet is high.

During this ramping process, a trickle of current simultaneously follows a parallel path through the persistent current switch, which is resistive, and this trickle of current causes Ohmic power deposition, and therefore heating, in the switch. Like the main magnet, the persistent current switch is made of multiple filaments of superconductor (typically Nb—Ti) embedded in a metal matrix; however, the main superconducting wire consists of superconductor embedded in a matrix of high-purity copper which has low resistivity at cold temperatures, while in contrast the persistent current switch superconducting wire consists of superconductor embedded in a matrix of a metal alloy which has significantly higher resistivity at cryogenic temperatures when compared with pure copper (typically the matrix is a copper-nickel alloy).

When the persistent current switch is cold and superconducting and the magnet is operating in persistent mode, the entire current circulating through the magnet also passes through the persistent current switch. The requirement of stability of the metal matrix of the switch superconducting wire limits the types of composition suitable for the alloy of the matrix. Furthermore, the cross-sectional dimensions of the wire and filament composition must be chosen to accommodate the full current of the magnet while in persistent mode. Therefore, once a suitable alloy is chosen for the metal matrix and dimensions are chosen, the resistance of the switch during non-superconducting conditions can be made higher mainly by making the wire longer.

To minimize power across the switch (Ohmic loss, resulting in heating), the switch resistance must be high, therefore the switch needs to be made from a long length of conductor because resistance is proportional to the length of the conductor while it is in its resistive state. However, as the length of the switch conductor increases, the overall mass of the switch increases proportionally. As the mass increases, it takes longer for the switch to cool down and return to a superconducting state once the target field has been achieved.

Since the completion of the ramping process requires the switch temperature to drop below the superconducting transition temperature, it is desirable to have the persistent current switch return quickly to cold superconducting conditions after the magnet has reached its target field to shorten the overall time of the ramping process.

SUMMARY

In the present invention, a system and method is provided for an optimized persistent current switch design that cools down quickly to superconducting conditions after the MRI magnet has ramped to field. Such a persistent current switch is advantageous for any MRI system designed to ramp to field in a relatively short amount of time.

Thus, by one aspect of the present invention, a persistent current switch for fast ramping of a superconducting magnet of an MRI system is provided. The persistent current switch includes a persistent current switch wire connected in series with a main magnet of the MRI system. The length of the persistent current switch wire is distributed in at least one layer over a bobbin. Each of the layers of the persistent current switch wire is in contact with at least one thermally conductive cooling surface. The persistent current switch wire is a superconductor below a threshold temperature and the contact with the cooling surface cools the persistent current switch wire to the threshold temperature.

By another aspect of the present invention, a method for fast ramping of an MRI system is provided. The method includes connecting a length of a persistent current switch wire in series with a main magnet of an MRI system and distributing the length of the persistent current switch wire in at least one layer over a bobbin. Each of the layers of the persistent current switch wire is in contact with at least one thermally conductive cooling surface and the cooling surface cools the persistent current switch wire to a threshold temperature for the persistent current switch wire to comprise a superconductor.

The foregoing and other aspects and advantages of the present disclosure will appear from the following description. In the description, reference is made to the accompanying drawings that form a part hereof, and in which there are shown by way of illustration preferred embodiments. Such embodiments do not necessarily represent the full scope of the disclosure, however, and reference is made therefore to the claims and herein for interpreting the scope of the disclosure.

DETAILED DESCRIPTION

Figure 1:
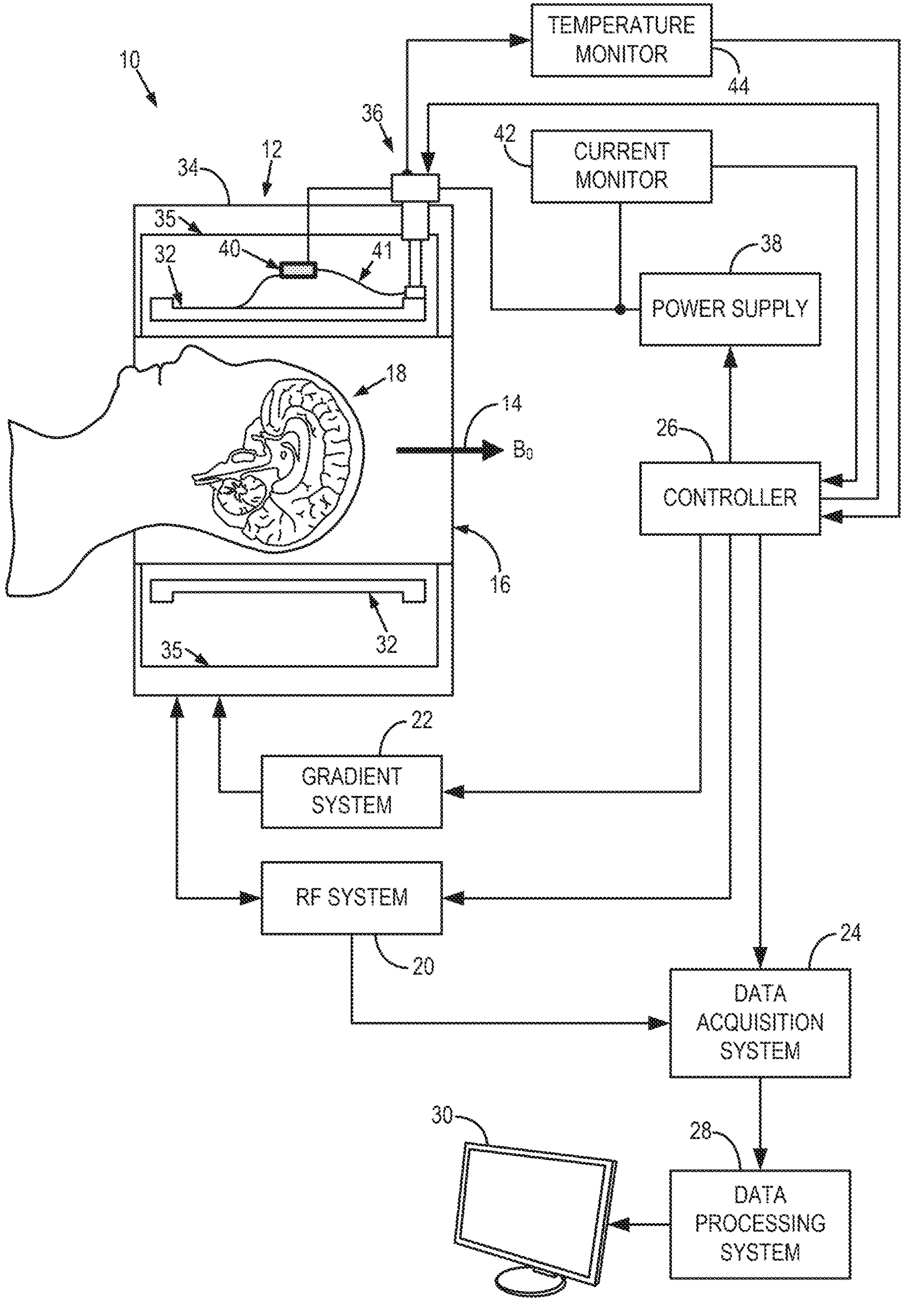
FIG. 1 is a schematic diagram of an example magnetic resonance imaging ("MRI") system capable of rapid magnetic field ramping. A superconducting persistent switch is shown with a thermal connection to a cooling source.

Described here are systems and methods for the design of a persistent current switch enabling rapid magnetic field ramping of an MRI system.

Recently, there have been advances in superconductors and superconducting magnet design aimed at reducing the amount of liquid cryogen (liquid helium) required to achieve and maintain superconducting properties. Most superconducting magnets use so-called low temperature superconductors, typically Niobium-Titanium, which has a critical temperature of 9.2 K. Cryogen-free superconducting magnets, also known as dry magnets, using low-temperature superconductors, have been used for MRI, where the cooling is supplied by a cryocooler in direct or indirect thermal contact with the magnet coils, requiring less or no liquid cryogen for operation. Other advances include the development of high temperature superconductors that are materials that can be in a superconducting state at higher temperatures, which make the cooling requirements less extreme for a superconducting magnet. Currently, high temperature superconductors suitable for magnet winding include Niobium-Tin up to 18.3 K critical temperature or Magnesium Diboride up to 39 K critical temperature.

The systems and methods described in the present disclosure are based on a superconducting magnet design where the main magnetic field can be turned on and off in a short amount of time. For instance, the magnetic field can be turned on and off in an amount of time comparable to the typical amount of time it takes to prepare a subject to be imaged in an MRI system (e.g., about 5-15 minutes).

The systems and methods described here are also based on cryogen-free superconducting magnet designs which do not have a large bath of liquid cryogen in thermal contact with the magnet internal structures. The MRI system described here is based on typical low temperature superconductors, such as Niobium-Titanium, but the systems and methods may also be extended to apply to MRI systems based on high temperature superconductors with appropriate modifications.

The MRI system described here uses a cryocooler that is in thermal contact with the magnet coils, or wire packs, in a superconducting magnet to cool them to temperatures approaching 4 K. Here, thermal contact can include direct or indirect contact, through which thermal energy can be transferred or conducted.

In this system, the rate of current change (and thus the rate of magnetic field change) can be controlled so that the temperature of the superconducting wire does not exceed the superconducting transition temperature. In this manner, the superconducting wire maintains its superconducting properties throughout the ramping process and does not enter a normal mode, or resistive state, to cause an uncontrolled loss of magnetic field (i.e., a quench). Furthermore, the control system described here provides a simple user interaction for turning the magnetic field on and off, monitors the temperature of the magnet coils during and after magnetic field ramping, and is capable of adjusting the ramp function or ramp rate, the interval between turning the magnetic field on and off, or both, in order to maintain temperatures that are cold enough to maintain superconducting properties of the magnet coils.

Referring now to FIG. 1, a magnetic resonance imaging system 10 generally includes a magnet assembly 12 for providing a magnetic field 14 that is substantially uniform within a bore 16 that may hold a subject 18 or other object to be imaged. The magnet assembly 12 supports a radio frequency ("RF") coil (not shown) that may provide an RF excitation to nuclear spins in the object or subject 18 positioned within the bore 16. The RF coil communicates with an RF system 20 producing the necessary electrical waveforms, as is understood in the art.

The magnet assembly 12 also supports three axes of gradient coils (not shown) of a type known in the art, and which communicate with a corresponding gradient system 22 providing electrical power to the gradient coils to produce magnetic field gradients. A data acquisition system 24 connects to RF reception coils (not shown) that are supported within the magnet assembly 12 or positioned within bore 16.

The RF system 20, gradient system 22, and data acquisition system 24 each communicate with a controller 26 that generates pulse sequences that include RF pulses from the RF system 20 and gradient pulses from gradient system 22. The data acquisition system 24 receives magnetic resonance signals from the RF system 20 and provides the magnetic resonance signals to a data processing system 28, which operates to process the magnetic resonance signals and to reconstruct images therefrom. The reconstructed images can be provided to a display 30 for display to a user.

The magnet assembly 12 includes one or more magnet coils 32 housed in a vacuum housing 34, which generally provides a cryostat for the magnet coils 32, and cooled by a cryocooler 36, such as a Gifford-McMahon ("GM") cryocooler or a pulse tube cryocooler ("PT").

In general, the cryocooler 36 is in thermal contact with the magnet coils 32 and is operable to lower the temperature of the magnet coils 32 and to maintain the magnet coils 32 at a desired operating temperature. In some embodiments the cryocooler 36 includes a first stage in thermal contact with a thermal shield 35 and a second stage in thermal contact with the magnet coils 32. In these embodiments, the first stage of the cryocooler 36 maintains the thermal shield 35 at a first temperature lower than the temperature of the vacuum housing 34, and the second stage of the cryocooler 36 maintains the magnet coils 32 at a second temperature that is lower than the first temperature. In other embodiments, the cryocooler 36 may include a single stage or greater than 2 stages with one stage being the coldest stage in thermal contact with the magnet coils 32.

The magnet coils 32 are composed of wires containing superconducting material and therefore provide a superconducting magnet. The superconducting material is preferably selected to be a material with a suitable critical temperature such that the magnet coils 32 are capable of achieving desired magnetic field strengths over a range of suitable temperatures. As one example, the superconducting material can be Niobium-Titanium ("NbTi"), which has a transition temperature of about 9.2 K. As another example, the superconducting material can be Niobium-Tin ("Nb3Sn"), which has a transition temperature of about 18.3 K.

The choice of superconducting material and composition of the superconducting wire will influence the range of magnetic field strengths achievable with the magnet assembly 12. Preferably, the superconducting wire is chosen such that magnetic field strengths in the range of about 0.5 T to about 3.0 T can be achieved in bore 16 of the MRI scanner over a range of temperatures that can be suitably achieved by the cryocooler 36. In some configurations, however, the superconducting wire can be chosen to be capable of providing magnetic field strengths higher than 3.0 T.

The cryocooler 36 is operable to maintain the magnet coils 32 at an operational temperature at which the magnet coils 32 are superconducting, such as a temperature that is below the transition, or critical, temperature for the superconducting material of which the magnet coils 32 are composed. This transition temperature depends not only on the superconducting material and its form in the superconducting wire, but also on the magnetic field and electrical current in the wires of the magnet coils 32. As one example, a lower operational temperature limit can be about 4 K and an upper operational temperature limit can be at or near the transition, or critical, temperature of the superconducting material of which the magnet coils 32 are composed.

The current density in the magnet coils 32 in the MRI system 10 of the present invention is controllable to rapidly ramp up or ramp down the magnetic field 14 generated by the magnet assembly 12 while controlling the temperature of the magnet coils 32 with the cryocooler 36 to keep the temperature below the transition temperature of the superconducting material of which the magnet coils 32 are composed. As one example, the magnetic field 14 can be ramped up or ramped down on the order of minutes, such as fifteen minutes or less.

In general, the current density in the magnet coils 32 can be increased or decreased by connecting the magnet coils 32 to a circuit with a power supply 38 that is in electrical communication with the magnet coils 32 via a switch 40 and operating the power supply 38 to increase or decrease the current in the connected circuit. The switch 40 is generally a superconducting switch that is operable between a first, closed, state and a second, open, state.

When the switch 40 is in its closed state, the magnet coils 32 are in a closed circuit, which is sometimes referred to as "persistent mode." In this configuration, the magnet coils 32 and the switch 40 are both in a superconducting state so long as the temperatures of the magnet coils 32 and the switch 40 are maintained at a temperature at or below the transition temperature of the superconducting material of which they are composed. With the switch 40 in this state, there is essentially zero electrical resistance across the switch and because the self-inductance of the switch 32 is extremely small compared to the self-inductance of the magnet, the power supply 38 is incapable of changing the current circulating in the magnet coils 32.

When the switch 40 is heated to a temperature above its superconducting transition temperature, the switch is in its open state where there is a relatively high electrical resistance across the switch, for example 100 Ohms. In this state, the power supply 38 is capable of changing the current circulating in the magnet coils 32 and only a trickle of current may pass through the switch 40 as a result of the voltage across the terminals of the power supply 38. For instance, if the power supply 38 is operated to supply more current to the connected circuit, the current in the magnet coils 32 will increase, which will increase the strength of the magnetic field 14. On the other hand, if the power supply 38 is operated to decrease the current in the connected circuit, the current in the magnet coils 32 will decrease, which will decrease the strength of the magnetic field 14. In this manner, the magnetic field 14 of the magnet can be ramped up or ramped down.

When the current circulating the magnet coils 32 has reached the desired value, the switch 40 is allowed to cool below its superconducting transition temperature and thus eventually change to its closed state. After the switch 40 is in its closed state, the power supply 38 may be disconnected or disabled and the magnet will maintain its magnetic field 14 indefinitely.

It will be appreciated by those skilled in the art that any suitable superconducting switch can be used for selectively connecting the magnet coils 32 and power supply 38 into a connected circuit; however, as one non-limiting example, the switch 40 may include a length of superconducting wire wound onto a spool in a bifilar arrangement that is connected in parallel to the magnet coils 32 and the power supply 38. To operate such a switch 40 into its open state, a heater (not shown) in thermal contact with the switch 40 is operated to raise the temperature of the superconducting wire above its transition temperature, which in turn makes the wire highly resistive compared to the inductive impedance of the magnet coils 32. As a result, very little current will flow through the switch 40 compared with the magnet coils 32 with the power supply 38 operating in the connected circuit.

When the magnet coils 32 are in the connected circuit with the power supply 38, the temperature of the magnet coils 32 will increase as the current in the magnet coils 32 changes. Thus, the temperature of the magnet coils 32 should be monitored to ensure that the temperature of the magnet coils 32 remains below the transition temperature for the superconducting material of which they are composed. Because placing the magnet coils 32 into a connected circuit with the power supply 38 will tend to increase the temperature of the magnet coils 32, the rate at which the magnetic field 14 can be ramped up or ramped down will depend in part on the cooling capacity of the cryocooler 36. For instance, a cryocooler with a larger cooling capacity will be able to remove heat at a higher rate from the magnet coils 32 while they are in a connected circuit with the power supply 38 and the current is changing.

The power supply 38 and the switch 40 operate under control from the controller 26 to provide current to the magnet coils 32 when the power supply 38 is in a connected circuit with the magnet coils 32. A current monitor 42 measures the current flowing to the magnet coils 32 from the power supply 38, and a measure of the current can be provided to the controller 26 to control the ramping up or ramping down of the magnetic field 14. In some configurations, the current monitor 42 is integrated into the power supply 38.

A temperature monitor 44 is connected to one or more temperature sensors (not shown) which are in thermal contact with components inside the magnet assembly 12, such as the magnet coils 32 and switch 40, and monitors these temperatures in real time. As one example, the temperature monitor 44 can be connected to a thermocouple temperature sensor, a diode temperature sensor (e.g., a silicon diode or a GaAlAs diode), a resistance temperature detector ("RTD"), a carbon ceramic temperature sensor, a capacitive temperature sensor, and so on. RTD-based temperature sensors can be composed of ceramic oxynitride, germanium, ruthenium oxide, or other suitable materials. The temperature of the magnet coils 32 and the switch 40 is monitored and the temperature data can be provided to the controller 26 to control the ramping up or ramping down of the magnetic field 14.

In operation, the controller 26 is programmed to ramp up or ramp down the magnetic field 14 of the magnet assembly 12 in response to instructions from a user. As mentioned above, the magnetic field 14 can be ramped down by decreasing the current density in the magnet coils 32 by reducing current to the magnet coils 32 from the power supply 38 via the switch 40, which is controlled by the controller 26. Likewise, the magnetic field 14 can be ramped up by increasing the current density in the magnet coils 32 by increasing current to the magnet coils 32 from the power supply 38 via the switch 40, which is controlled by the controller 26.

The controller 26 is also programmed to monitor various operational parameter values associated with the MRI system 10 before, during, and after ramping the magnetic field 14 up or down. As one example, as mentioned above, the controller 26 can monitor the current supplied to the magnet coils 32 by the power supply 38 via data received from the current monitor 42. As another example, as mentioned above, the controller 26 can monitor the temperature of the magnet coils 32 via data received from the temperature monitor 44. As still another example, the controller 26 can monitor the strength of the magnetic field 14, such as by receiving data from a magnetic field sensor, such as a Hall probe or NMR probe or the like, positioned in or proximate to the bore 16 of the magnet assembly 12.

Over the course of a ramping cycle, the total energy deposited into the system due to the ramping can be approximated by:

$$E_T = E_H + \int_0^{\tau} \frac{V(t)^2}{R} dt$$

Where $E_H$ is the hysteresis loss of the wire, V(t) is the voltage across the superconducting switch as a function of time, R is the resistance of the superconducting switch in its normal (non-superconducting) state, and $\tau$ is the total ramping time. Here, other less significant secondary effects are excluded, such as Ohmic loss due to eddy currents in the conducting structures in the magnet or heating due to the magnet power leads.

The power being deposited at a certain time during the ramp is given by:

$$P(t) = \frac{\partial E_H(t)}{\partial t} + \frac{V(t)^2}{R}$$

The hysteresis losses in superconductors are an important consideration for a fast ramping MRI system. These losses can be minimized by appropriate choice of superconducting wire. However, once the superconducting wire of the system has been chosen, these losses can be considered constant and independent of the persistent current switch.

In changing magnetic fields, the superconductor filaments are magnetically coupled. For example, screening currents will go down the left filaments, and back up the right filaments to form a loop. The coupling currents behave like eddy currents and produce an additional magnetization. The AC losses from coupling currents are proportional to $$\left(\frac{dB}{dt}\right)^2,$$

hence they are much smaller than the hysteresis losses when $$\frac{dB}{dt}$$

is relatively small e.g. ramp times on the order of minutes. When this is the case, the power deposited by coupling currents can be neglected.

With respect to the magnet power supply charging leads, a superconducting switch is electrically parallel with the magnet windings. The switch itself is typically wound in a bifilar manner that allows its inductance to be small and negligible in comparison with the magnet windings. A switch heater is used to make the switch resistive during ramping by increasing its temperature locally. In some methods of ramping, the switch heater is on during the duration of the ramping operation to maintain a switch temperature higher than the superconducting transition temperature. In other implementations, the heater is only on temporarily, and the power deposited across the switch due to the voltage across the switch during ramping is used to keep the switch resistive. When the switch is resistive, the power supply is turned on and a voltage, V, is applied. The voltage applied across the switch is related to the ramping time, t, magnet inductance, L, electrical current, I, and resistance through the resistive leads and joints, r, by the equation:

$$L\frac{dI}{dt} = V - Ir$$

Assuming a negligible contribution from the resistance of the resistive leads and joints, this equation can be simplified to:

$$V = L\frac{dI}{dt}$$

During the ramp, when the switch is resistive, the power deposited across the switch is given by:

$$P_{switch} = \frac{V^2}{R} = \frac{L^2}{R}\left(\frac{dI}{dt}\right)^2$$

When ramping from zero field to the nominal current at a constant rate over a total ramping time, t, this equation can be simplified to:

$$P_{switch} = \frac{L^2 I^2}{R\tau^2}$$

We require this quantity to be within the capacity of the cryocooler second stage, so it must be relatively small; therefore, one would like the inductance and operating current of the magnet to be small and the resistance of the switch to be large.

To keep the power deposited within the switch small, the resistance in the normal (non-superconducting) state needs to be large. For instance, a magnet with 10 H inductance, charged with 300 A of current in 300 seconds (5 minutes) will deposit a power across the switch of:

$$P_{switch} = \frac{100}{R} \mathrm{W}$$

To keep this value less than or equal to 500 mW, the resistance of the switch in its normal state must be at least 200Ω.

The normal state resistance of a section of switch wire with resistivity, ρ, cross-sectional area, α, and length, λ, is given by:

$$R = \rho\frac{\lambda}{\alpha}$$

The cross-sectional area of the switch wire will depend on the maximum current in the magnet. The switch wire must be able to safely carry this current when in its superconducting mode.

In practice, the switch wire is composed of a filament or multiple filaments of superconductor, such as NbTi, embedded in a matrix and each of these constituents contributes to the total resistance of the switch wire. In the proceeding discussion, we shall assume that the term α/β is an expression for the total effective cross section to resistivity ratio at the relevant temperature of the switch during ramping. This can be computed by the following expression where $\alpha_s$ and $\rho_s$ represent the total cross section and resistivity of the superconductor filament or filaments and $\alpha_m$ and $\rho_m$ represent the total cross section and resistivity of the matrix:

$$\frac{\alpha_{total}}{\rho_{total}} = \frac{\alpha_s}{\rho_s} + \frac{\alpha_m}{\rho_m}$$

The resistivity of the matrix material of the wire should be as high as possible at low temperatures; therefore, it should have a low residual resistivity ratio (RRR) value. There is a practical upper-bound on the resistivity of the superconductor stabilizer, the more resistive this material becomes, the less stable the wire under superconducting conditions. A commonly used high resistivity matrix material is CuNi alloy at a ratio of 70% copper to 30% nickel. At this ratio, the RRR of the material is around 1.06 and the resistivity at room temperature is 33.16 μΩcm.

When the magnet is in persistent mode, the switch is in series with the magnet windings and therefore must convey the entire current while operating in a magnetic field. A designer must select an appropriate superconductor filament configuration for the switch wire suitable for the expected combination of current, field and temperature.

With the total effective cross-sectional area to resistivity ratio, α/ρ, set from the choice in switch wire, the only knob left to turn to increase the resistance is the length of wire. For a given target resistance, resistivity, and cross-sectional area, the total length of switch wire required is:

$$\lambda = R\frac{\alpha}{\rho}$$

In our example where the target resistance is 200Ω, assuming a uniform switch wire of diameter 0.9 mm and CuNi:NbTi ratio of 1.5:1 with CuNi and NbTi resistivities at 15K of 31.4 μΩ-cm and 56.5 μΩ-cm, respectively, the total length of switch wire needed is approximately 375 m.

Relationship of Switch Length to Power and Ramp Time:

Substituting the equation for switch resistance into the equation for power across the switch from earlier, we end up with:

$$P_{switch} = \frac{\alpha L^2 I^2}{\rho \lambda \tau^2}$$

where α/ρ is the effective cross-section area to resistivity ratio of the switch wire at the equilibrium temperature the switch is at during the ramp. Here we see that the power across the switch is inversely proportional to the length of the switch wire. That is, the shorter the switch wire, the greater the power across the switch, and the more the switch will heat up during ramping. Furthermore, for a given power, the ramp time is given by:

$$\tau_{ramp} = LI\sqrt{\frac{\alpha}{\rho \lambda P_{switch}}}$$

from which, we see that the ramp time is inversely proportional to the square root of the switch wire length.

Switch Cooling Time

The switch cooling time is the time required for the switch to change from an initial temperature, $T_1$, after ramping, to a final temperature, $T_2$. The initial temperature must be large enough for the switch to be in the normal resistive state during ramping and the final temperature must be low enough such that the switch is back in the superconducting state.

For a given cooling rate $P_c(T, t)$, the time required to change the switch temperature an infinitesimal amount is given by:

$$dt = \frac{\tilde{\rho}\alpha\lambda C(T)dT}{P_c(T, t)}$$

where C(T), $\tilde{\rho}$, α, and λ are the effective heat capacity, density, cross-sectional area, and total length of the switch wire, respectively, taking into account the effect of both superconductor and matrix constituents.

The total time required to go from $T_1$ to $T_2$ is:

$$\tau_{switch} = \tilde{\rho}\alpha\lambda\int_{T_1}^{T_2}\frac{C(T)}{P_c(T, t)}dT$$

$$\tau_{switch} = \tilde{\rho}\alpha\lambda\Phi$$

-continued where $$\Phi = \int_{T_1}^{T_2} \frac{C(T)}{P_c(T, t)} dT$$

Total Effective Ramp Time

The total effective ramp time is the time required to ramp to field and the time required to cool the switch. We see that the switch cooling time is directly proportional to the switch wire length. Conversely, from the earlier analysis, shortening the switch wire length increases the ramp time for a given power deposition across the switch. Therefore, there will be an optimal switch wire length for a given cooling connection and power deposited across the switch.

Similarly, for a given switch wire length, the cooldown time of the switch can be reduced by increasing the cooling connection, thereby increasing $P_c(T, t)$.

Figure 2:
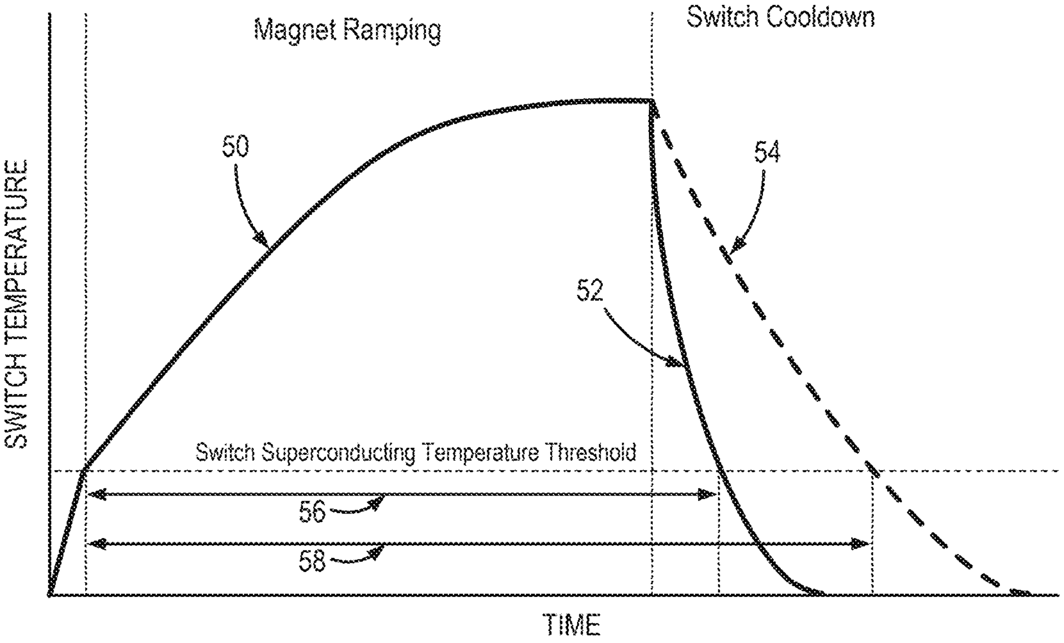
FIG. 2 is a plot illustrating an example of superconducting switch temperature as a function of time during a magnet ramping process followed by a switch cooldown with and without an optimal design.

Looking now to FIG. 2, a plot is shown displaying switch temperature vs time for a ramping procedure. Initially the switch heater is turned on, bringing the switch temperature above the superconducting threshold. Next, the magnet begins ramping, during this time, the switch temperature increases due to the power deposited across the switch exceeding the amount of power removed via cooling connection as seen on curve 50. At the end of the ramping procedure, the switch cools back down with cooling curve 52. The total effective ramp time is the total time the switch is above the superconducting temperature threshold 56. Decreasing the effectiveness of the switch cooling connection (curve 54) will increase the total effective ramp time as seen with the larger total time 58 compared to 56.

It is important to note that for the switch to transition from resistive to superconducting, the entire length of switch wire must be cooled below the threshold temperature. Therefore, it is imperative that the cooling of the switch is as uniformly distributed as possible so as not to waste cooling capacity where it is not needed.

For such switch designs where the rate of heat transmission in the assembly is relatively high, then it is possible to place the heater in a variety of positions while remaining effective.

Figure 3A:
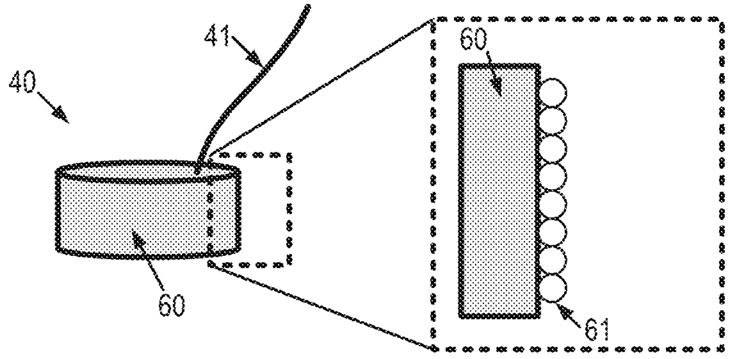
FIGS. 3*a-c* illustrate several embodiments of a persistent current switch optimized for a rapid cooldown time.

Looking now at FIG. 3*a*, an example embodiment of a fast-cooling switch is shown. In this embodiment, the switch wire length is distributed evenly over a single layer 61 in uniform contact with a bobbin made of thermally conductive material 60. The bobbin is subsequently thermally connected to the cooling system of the magnet at 41 forming a cooling connection to the switch wire. The bobbin is cylindrical in shape, the length and diameter of the cylinder specified to distribute the total length of switch wire over a single layer.

Figure 3B:
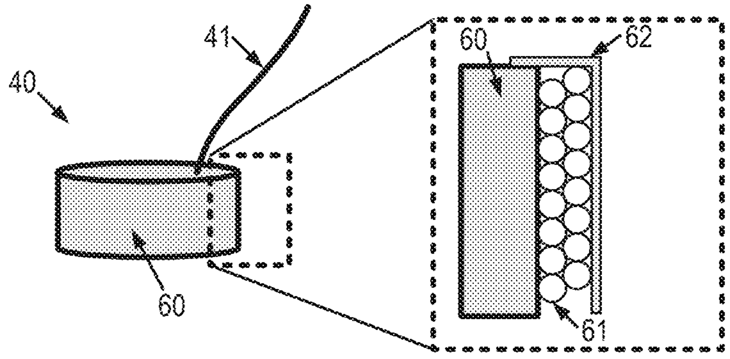

In yet another embodiment displayed in FIG. 3*b*. The switch wire is distributed over two layers at 61, thermally connected to a cylindrical bobbin made of thermally conductive material at 60, where the thermally conductive material extends outward enclosing the outer layer of switch wire at 62. In this embodiment, the switch wire is still uniformly cooled from both the inner and outer layers of the cooling system.

Figure 3C:
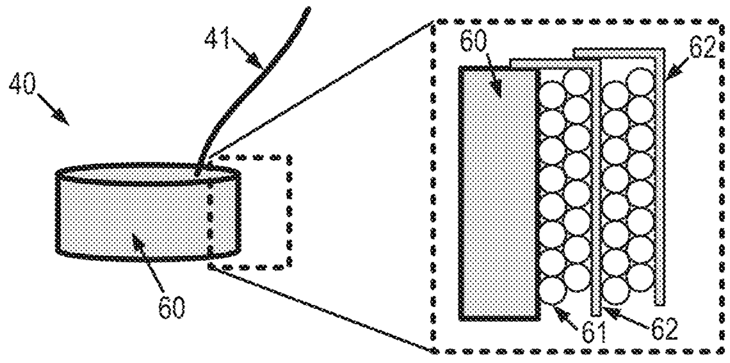

In yet another embodiment displayed in FIG. 3*c*. The switch wire is distributed over 4 layers, with three total cooling layers, the inner bobbin surface, a cooling layer between switch wire layers 2 and 3, and an outer cooling layer outside of layer 4. In this embodiment, each switch layer is equally cooled by contact of a single cooling layer.

An example embodiment of where the switch heater could be located would be directly on the thermally conductive bobbin 60 or on any of the extended cooling layers 62. In another example embodiment, the heater wire could be placed at the thermal connection to the magnet 41. In yet another example embodiment, the heater could be placed directly on the switch wire layers 61.

Although all of the embodiments described in FIGS. 3*a-c* include a thermally conductive bobbin 60, it is possible to have a fast cooldown switch with a thermally insulating bobbin, so long as each wire layer 61 is in close contact with thermally conductive cooling extensions 62 and these extensions are in thermal contact with the cooling system of the magnet at 41.

These designs can be extended to any combination of switch and cooling layers. Each cooling layer can consist of a thin thermal conductor, which may be perforated to allow epoxy adhesion and penetration. The type and amount of thermal conductor can be tuned for a desired amount of cooling capacity. The main principle is that every layer of switch wire 61 is in direct contact with at least one highly thermally conductive extension 62 or some other thermally conductive structure, for example, a thermally conductive bobbin 60.

General Considerations

While some embodiments or aspects of the present disclosure may be implemented in fully functioning computers and computer systems, other embodiments or aspects may be capable of being distributed as a computing product in a variety of forms and may be capable of being applied regardless of the particular type of machine or computer readable media used to actually effect the distribution.

At least some aspects disclosed may be embodied, at least in part, in software. That is, some disclosed techniques and methods may be carried out in a computer system or other data processing system in response to its processor, such as a microprocessor, executing sequences of instructions contained in a memory, such as read-only memory (ROM), volatile random access memory (RAM), non-volatile memory, cache or a remote storage device.

A computer readable storage medium may be used to store software and data which when executed by a data processing system causes the system to perform various methods or techniques of the present disclosure. The executable software and data may be stored in various places including for example ROM, volatile RAM, non-volatile memory and/or cache. Portions of this software and/or data may be stored in any one of these storage devices.

Examples of computer-readable storage media may include, but are not limited to, recordable and non-recordable type media such as volatile and non-volatile memory devices, ROM, RAM, flash memory devices, floppy and other removable disks, magnetic disk storage media, optical storage media (e.g., compact discs (CDs), digital versatile disks (DVDs), etc.), among others. The instructions can be embodied in digital and analog communication links for electrical, optical, acoustical or other forms of propagated signals, such as carrier waves, infrared signals, digital signals, and the like. The storage medium may be the internet cloud, or a computer readable storage medium such as a disc.

Furthermore, at least some of the methods described herein may be capable of being distributed in a computer program product comprising a computer readable medium that bears computer usable instructions for execution by one or more processors, to perform aspects of the methods described. The medium may be provided in various forms such as, but not limited to, one or more diskettes, compact disks, tapes, chips, USB keys, external hard drives, wire-line transmissions, satellite transmissions, internet transmissions or downloads, magnetic and electronic storage media, digital and analog signals, and the like. The computer useable instructions may also be in various forms, including compiled and non-compiled code.

At least some of the elements of the systems described herein may be implemented by software, or a combination of software and hardware. Elements of the system that are implemented via software may be written in a high-level procedural language such as object oriented programming or a scripting language. Accordingly, the program code may be written in C, C++, J++, or any other suitable programming language and may comprise modules or classes, as is known to those skilled in object oriented programming. At least some of the elements of the system that are implemented via software may be written in assembly language, machine language or firmware as needed. In either case, the program code can be stored on storage media or on a computer readable medium that is readable by a general or special purpose programmable computing device having a processor, an operating system and the associated hardware and software that is necessary to implement the functionality of at least one of the embodiments described herein. The program code, when read by the computing device, configures the computing device to operate in a new, specific and predefined manner in order to perform at least one of the methods described herein.

While the teachings described herein are in conjunction with various embodiments for illustrative purposes, it is not intended that the teachings be limited to such embodiments. On the contrary, the teachings described and illustrated herein encompass various alternatives, modifications, and equivalents, without departing from the described embodiments, the general scope of which is defined in the appended claims. Except to the extent necessary or inherent in the processes themselves, no particular order to steps or stages of methods or processes described in this disclosure is intended or implied. In many cases the order of process steps may be varied without changing the purpose, effect, or import of the methods described.

What is claimed is:

1. A persistent current switch for fast ramping of a magnetic resonance imaging (MRI) system, the persistent current switch comprising:
- a length of a persistent current switch wire having a first end and a second end, wherein:
  - the first and second ends of the length of wire are connected in series with a main magnet of the MRI system;
  - the length of the persistent current switch wire is distributed in at least one layer over a bobbin; and further wherein
  - each of the at least one layer of the persistent current switch wire is in contact with at least one thermally conductive cooling surface, wherein the at least one thermally conductive cooling surface comprises a perforated thermally conductive material configured to permit an epoxy adhesive to penetrate therethrough to secure the persistent current switch wire to the at least one thermally conductive cooling surface; and
  - the persistent current switch wire comprises a superconductor below a threshold temperature and the contact with the cooling surface cools the persistent current switch wire to the threshold temperature.

2. The persistent current switch of claim 1, wherein the cooling surface comprises at least one thermally conductive cooling extension in thermal contact with a cooling system of the main magnet.

3. The persistent current switch of claim 1, wherein the persistent current switch wire is distributed in a single layer over the bobbin and the cooling surface comprises the bobbin.

4. The persistent current switch of claim 1, wherein the persistent current switch wire is distributed in a first inner layer and a second outer layer, and the cooling surface comprises the bobbin and a cooling extension over the second outer layer of the persistent current switch wire, such that each layer is in close thermal contact with at least one of the bobbin and the cooling extension.

5. The persistent current switch of claim 1, wherein the persistent current switch wire is distributed in at least two layers and the cooling surface comprises the bobbin and at least one cooling extension between every two layers of the persistent current switch wire, such that each layer is in close thermal contact with at least one of the bobbin and the at least one cooling extension.

6. The persistent current switch of claim 1, wherein the MRI system comprises a low cryogen MRI system, a cryogen-free MRI system or a dry MRI system.

7. The persistent current switch of claim 1, wherein the persistent current switch is not in contact with a liquid cryogen.

8. The persistent current switch of claim 7, wherein the liquid cryogen comprises liquid helium.

9. The persistent current switch of claim 1, wherein the thermally conductive surface facilitates fast cooldown of the persistent switch after ramping the main magnet.

10. The persistent current switch of claim 1, wherein the main magnet has a ramping time of less than 15 minutes.

11. A method for fast ramping of an MRI system, the method comprising:
- connecting a first end and a second end of a length of a persistent current switch wire in series with a main magnet of an MRI system;
- distributing the length of the persistent current switch wire in at least one layer over a bobbin; wherein
  - each of the at least one layer of the persistent current switch wire is in contact with at least one thermally conductive cooling surface, wherein the at least one thermally conductive cooling surface comprises a perforated thermally conductive material configured to permit an epoxy adhesive to penetrate therethrough to secure the persistent current switch wire to the at least one thermally conductive cooling surface; and
  - the contact with the cooling surface cools the persistent current switch wire to a threshold temperature for the persistent current switch wire to comprise a superconductor.

12. The method of claim 11, wherein the cooling surface comprises at least one thermally conductive cooling extension in thermal contact with a cooling system of the main magnet.

13. The method of claim 11, wherein the distributing the length of the persistent current switch wire comprises distributing the length of the persistent current switch wire in a single layer over the bobbin and the cooling surface comprises the bobbin.

14. The method of claim 11, wherein the distributing the length of the persistent current switch wire comprises distributing the length of the persistent current switch wire in a first inner layer and a second outer layer, and the cooling surface comprises the bobbin and a cooling extension over the second outer layer of the persistent current switch wire, such that each layer is in close thermal contact with at least one of the bobbin and the cooling extension.

15. The method of claim 11, wherein the distributing the length of the persistent current switch wire comprises distributing the length of the persistent current switch wire in at least two layers and the cooling surface comprises the bobbin and at least one cooling extension between every two layers of the persistent current switch wire, such that each layer is in close thermal contact with at least one of the bobbin and the at least one cooling extension.

16. The method of claim 11, wherein the MRI system comprises a low cryogen MRI system, a cryogen-free MRI system, or a dry MRI system.

17. The method of claim 11, wherein the persistent current switch is not in contact with a liquid cryogen.

18. The method of claim 17, wherein the liquid cryogen comprises liquid helium.

19. The method of claim 11, wherein the thermally conductive surface facilitates fast cooldown of the persistent switch after ramping the main magnet.

20. The method of claim 11, wherein the main magnet has a ramping time of less than 15 minutes.

* * * * *